United States Patent
Hirose et al.

(10) Patent No.: US 7,180,368 B2
(45) Date of Patent: Feb. 20, 2007

(54) DISTORTION COMPENSATION CIRCUIT, DISTORTION COMPENSATION SIGNAL GENERATING METHOD, AND POWER AMPLIFIER

(75) Inventors: Nobuo Hirose, Kodaira (JP); Nobuo Tsukamoto, Kodaira (JP); Fumihito Tomaru, Kodaira (JP); Seiichi Sano, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 125 days.

(21) Appl. No.: 10/488,963

(22) PCT Filed: Nov. 14, 2003

(86) PCT No.: PCT/JP03/14545

§ 371 (c)(1),
(2), (4) Date: Mar. 9, 2004

(87) PCT Pub. No.: WO2004/045067

PCT Pub. Date: May 27, 2004

(65) Prior Publication Data

US 2004/0232986 A1    Nov. 25, 2004

(30) Foreign Application Priority Data

Nov. 14, 2002  (JP)  ............... 2002-331430
Feb. 7, 2003   (JP)  ............... 2003-030439

(51) Int. Cl.
*H03F 1/26* (2006.01)
(52) U.S. Cl. ..................... 330/149; 330/136
(58) Field of Classification Search .................. None (56) References Cited

U.S. PATENT DOCUMENTS 6,552,609 B2 * 4/2003 Hamada et al. ............. 330/149
6,657,493 B2 * 12/2003 Ode et al. ................... 330/149
6,717,464 B2 * 4/2004 Fudaba et al. .............. 330/149

FOREIGN PATENT DOCUMENTS

| EP | 1 089 428 A2 | 4/2001 |
| JP | 2001-168774 | 6/2001 |
| WO | 00/74232 A1 | 12/2000 |
| WO | 01/20775 A1 | 3/2001 |

OTHER PUBLICATIONS

Seto et al., "An Adaptive Predistortion Method for Linear Power Amplifiers," Eijogakugiho (ITE Technical Report), vol. 24, No. 79, pp. 91-96, Institute of Image Information and Television Engineers, Tokyo, JP, Dec. 15, 2000.

* cited by examiner

Primary Examiner—Khanh Van Nguyen
(74) Attorney, Agent, or Firm—Mattingly, Stanger, Malur & Brundidge, P.C.

(57) ABSTRACT

A distortion compensating circuit for a power amplifier attains raised compensating accuracy with shorter convergence time by accurately and quickly generating a distortion compensation signal for pre-distortion. An error signal representing the difference between the input and output signals of the power amplifier is generated. From the error signal and the input signal, the coefficients of the third-order intermodulation distortion, fifth-order intermodulation distortion and seventh-order intermodulation distortion are calculated. According to these coefficients, a distortion compensating signal which is characteristically opposite in phase and gain to the intermodulation distortions is generated.

4 Claims, 6 Drawing Sheets

DISTORTION COMPENSATION CIRCUIT, DISTORTION COMPENSATION SIGNAL GENERATING METHOD, AND POWER AMPLIFIER

TECHNICAL FIELD

The present invention relates to a non-linear distortion compensating technique for reducing non-linear distortion components output from a transmitter that transmits radio waves amplified in power by a power amplifier.

BACKGROUND ART

An example of a conventional non-linear distortion compensating technique, in particular, a predistorting compensation method, is described in Eijogakugiho Vol. 24, No. 79, BCS2000-92 "An Adaptive Predistortion Method for Linear Power Amplifiers" (Non-patent Document 1). The following describes this technique with reference to FIG. 5 showing a block diagram of a transmitter including a prior art power amplifier.

Figure 5:
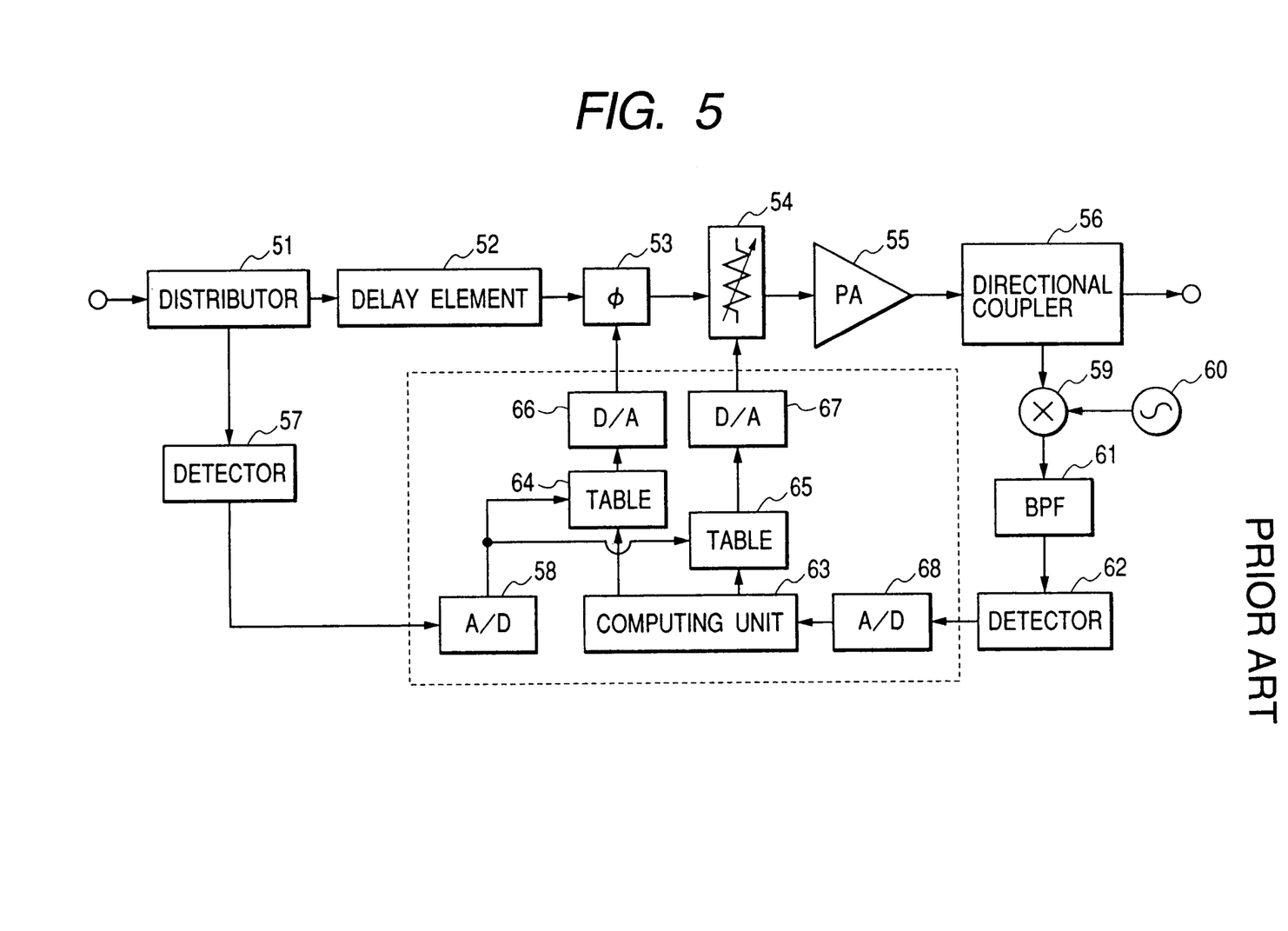
FIG. 5 is a block diagram of a prior art transmitter including a power amplifier.

In FIG. 5, an input signal to be transmitted goes through a distributor 51, a delay element 52, a phase controller 53 and a gain controller 54 and is power-amplified by a power amplifier 55 before output as an output signal through a directional coupler 56. Meanwhile, part of the input signal is distributed by the distributor 51 to a detector 57 and then converted to a digital signal by an A/D converter 58. Further, part of the power-amplified output signal is distributed to a mixer 59 and converted to an intermediate frequency by a synthesizer 60. Then, out-of-band distortion power introduced by the power amplifier 55 is extracted by a BPF 61 to a detector 62 and converted by an A/D converter 68 to a digital signal.

The following describes how the non-linear distortion compensating operation is controlled. The operations of the phase controller 53 and gain controller 54 are controlled according to signals obtained by respectively converting contents recorded in tables 66 and 67 to analog signals. The distortion that is equal in amplitude but opposite in phase to the distortion introduced by the power amplifier 55 is generated by the phase controller 53 and gain controller 54 so that non-linear compensation is performed by compensating for the distortion introduced by the power amplifier 55. In the tables 64 and 65, envelope signals detected by the detector 57 and brought in by the A/D converter 58 are given addresses. In addition, learning is performed in the computing unit 64 by the perturbation method so as to make smaller the distortion power to be detected by the detector 62. Contents in the tables 64 and 65 are successively updated to optimum values according to the learning results so as to minimize the distortion.

According to a table update method described in the aforementioned Non-patent Document 1, each of the table addresses incremented in steps of 1 is given a value by the perturbation method. However, this method is much impractical since the update requires considerably long time. It is more practical to apply the perturbation method to a predetermined representative points, for example, eight representative points, instead of every point.

Figure 6:
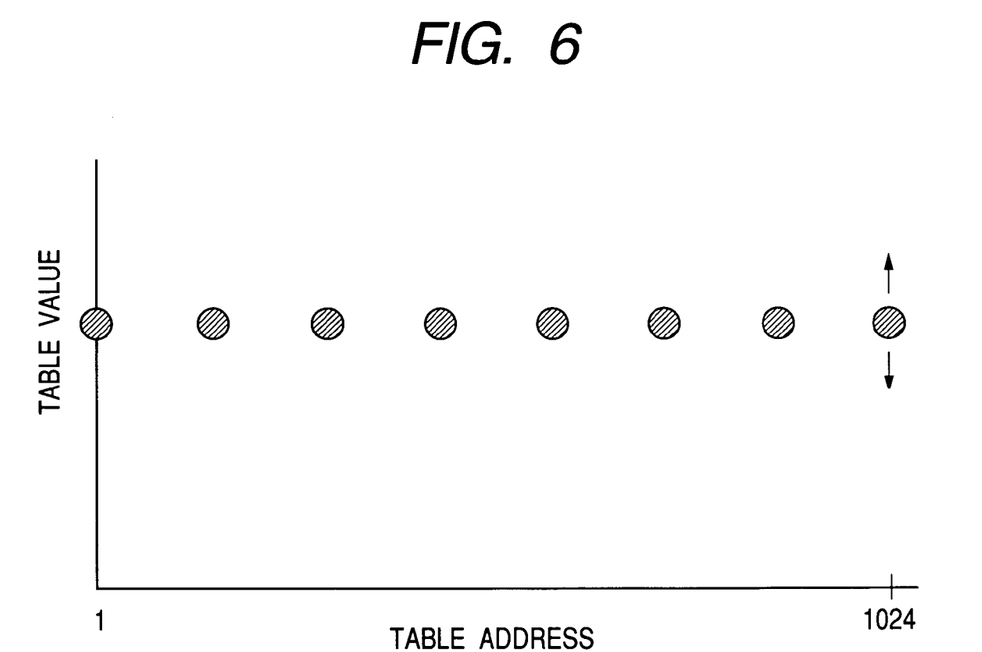
FIG. 6 is a diagram showing how representative points are related with table addresses when values are determined for the representative points by the perturbation method in FIG. 5.

FIG. 6 shows how the representative points are related with the table addresses. It is assumed here that there are table addresses 1 through 1024. The addresses 1 through 1024 are represented by eight points. In FIG. 6, each of the eight points is given a table value as indicated by a black circle. The eight representative addresses are given values (heights of the black circles). By increasing (as indicated by an upward arrow in the figure) and decreasing (as indicated by an downward arrow in the figure) a value while checking the distortion power, the value is updated to a value which decreased the distortion. This operation is repeated for the other representative points to optimize the table values. The values given to the remaining addresses other than the eight representative addresses are updated to those determined by means of interpolation using FIR filters. This update control is performed by applying the perturbation method to the values given to eight representative points per table or a total of sixteen points while checking the distortion power so as to optimize the tables.

Another prior art technique is also described in Japanese Patent Laid-open No. 2001-168774 (Patent Document 1). In this method, digital base band signals are extracted from the RF input and RF output of a RF amplifier to detect and eliminate the time and phase differences between the two signals. In order to compensate for distortion components, the amount of amplitude compensation and the amount of phase compensation are selected for the detected amplitude and phase errors between the two signals from an initially registered and adaptively updated table of compensation amounts associated with amplitude values and added successively to the RF input digital base band signal.

In the technique described in the aforementioned Non-patent Document 1, non-linear compensation made for the amplitude and phase distortion components is optimized by the perturbation method so as to minimize the distortion power while checking the distortion power. In this method, however, it is not possible to recognize the sizes of amplitude and phase distortions. In addition, it is not possible to recognize what amounts of the third, fifth and seventh-order amplitude distortion components are respectively contained in the amplitude distortion. Likewise it is not possible to recognize what amounts of the third, fifth and seventh-order phase distortion components are respectively contained in the phase distortion. Accordingly, it is clear that in this method, the accuracy of compensation is low and the compensating speed (convergence) is remarkably large.

In addition, the technique described in the aforementioned Patent Document 1 cannot make compensation for distortion when the amplitude is small since its simple detection of differences causes considerable errors when the amplitude is small.

SUMMARY OF THE INVENTION

It is an object of the present invention to provide a distortion compensating circuit, distortion compensating signal generating method and power amplifier which improve the accuracy of distortion compensation and increase the speed of convergence by accurately and quickly generating distortion compensating signals for pre-distortion.

According to an aspect of the present invention, there is provided a distortion compensating circuit which detects distortion components generated in a power amplifying circuit amplifying power of a high frequency input signal according to an output signal and an input signal of the power amplifying circuit; and generates a distortion compensating signal according to the detected distortion components, the distortion compensating circuit comprising:

an adjustment circuit which adjusts the input signal and the output signal so as to eliminate a level error, a phase error and a delay error between the input signal and the output signal;

a coefficient calculation circuit which calculates an error signal representing the difference between the adjusted input signal and output signal, and calculates, from the calculated error signal and the input signal, at least a coefficient, specific to the power amplifying circuit, of the third-order intermodulation distortion partly constituting the distortion components and additionally a coefficient, specific to the power amplifying circuit, of the fifth-order intermodulation distortion partly constituting the distortion components and a coefficient, specific to the power amplifying circuit, of the seventh-order intermodulation distortion partly constituting the distortion components; and a distortion compensating signal generating circuit which generates, according to the calculated coefficients, a distortion compensating signal which is characteristically opposite in phase and gain to the intermodulation distortions.

According to another aspect of the present invention, there is provided a distortion compensating signal generating method for detecting distortion components generated in a power amplifying circuit amplifying power of a high frequency input signal according to the output signal and the input signal; and generating a distortion compensating signal according to the detected distortion components, the distortion compensating signal generating method comprising the steps of:

adjusting the input signal and the output signal so as to eliminate a level error, a phase error and a delay error between the input signal and the output signal;

calculating an error signal representing the difference between the adjusted input signal and output signal, calculating, from the calculated error signal and the input signal, at least a coefficient, specific to the power amplifying circuit, of the third-order intermodulation distortion partly constituting the distortion components and additionally a coefficient, specific to the power amplifying circuit, of the fifth-order intermodulation distortion partly constituting the distortion components and a coefficient, specific to the power amplifying circuit, of the seventh-order intermodulation distortion partly constituting the distortion components are calculated; and generating, according to the calculated coefficients, a distortion compensating signal which is characteristically opposite in phase and gain to the intermodulation distortions.

According to yet another aspect of the present invention, there is provided a power amplifier comprising:

a power amplifying circuit which amplifies power of a high frequency input signal;

a distortion compensating circuit which detects distortion components generated in the power amplifying circuit according to the output signal and the input signal and generates a distortion compensating signal according to the detected distortion components; and an adder circuit which adds the generated distortion compensating signal to the input signal, wherein the distortion compensating circuit comprises:

an adjustment circuit which adjusts the input signal and the output signal so as to eliminate a level error, a phase error and a delay error between the input signal and the output signal;

an error signal calculation circuit which calculates an error signal representing the difference between the adjusted input signal and output signal;

a coefficient calculation circuit which calculate, from the calculated error signal and the input signal, at least a coefficient, specific to the power amplifying circuit, of the third-order intermodulation distortion partly constituting the distortion components and additionally a coefficient, specific to the power amplifying circuit, of the fifth-order intermodulation distortion partly constituting the distortion components and a coefficient, specific to the power amplifying circuit, of the seventh-order intermodulation distortion partly constituting the distortion components; and a distortion compensating signal generating circuit which generates, according to the calculated coefficients, a distortion compensating signal which is characteristically opposite in phase and gain to the intermodulation distortions.

According to still another aspect of the present invention, there is provided a distortion compensating circuit which detects distortion components generated in a power amplifying circuit amplifying power of a high frequency input signal according to an output signal and the input signal; and generates a distortion compensating signal according to the detected distortion components, the distortion compensating circuit comprising:

an autonomous correction compensating signal generating circuit for relatively large amplitude levels of the input signal, including:

an adjustment circuit which adjusts the input signal and the output signal so as to eliminate a level error, a phase error and a delay error between the input signal and the output signal;

a coefficient calculation circuit which calculates an error signal representing a difference between the adjusted input signal and output signal is calculated and, from the calculated error signal and the input signal, at least a coefficient, specific to the power amplifying circuit, of the third-order intermodulation distortion partly constituting the distortion components and additionally a coefficient, specific to the power amplifying circuit, of the fifth-order intermodulation distortion partly constituting the distortion components and a coefficient, specific to the power amplifying circuit, of the seventh-order intermodulation distortion partly constituting the distortion components; and a distortion compensating signal generating circuit which generates, according to the calculated coefficients, a distortion compensating signal which is characteristically opposite in phase and gain to the intermodulation distortions; and a fixed correction compensating signal generating circuit for small amplitude levels of the input signal, which generates a distortion compensating signal characteristically opposite to the input signal,

BEST MODE FOR CARRYING OUT THE INVENTION

The following describes an embodiment of the present invention.

In the embodiment of the present invention, two types of compensating signals according to respective input signal levels are generated for use as distortion compensating signals. One compensating signal is an autonomous correction-compensating signal for relatively large amplitude levels of the input signal. The other compensating signal is a fixed correction-compensating signal for relatively small levels of the input signal.

The autonomous correction-compensating signal is described below.

Firstly, a description will be made of the theory to determine the distortion introduced by a power amplifier so as to generate the distortion-compensating signal that counteracts the characteristic of the power amplifier. Generally, the power amplifying circuit is characterized by the following expanded equation (1) expressed with input signal Vin and output signal Vout:

$$V\text{out} = \alpha 0 + \alpha 1 \cdot V\text{in} + \alpha 2 \cdot V\text{in}^2 + \alpha 3 \cdot V\text{in}^3 + \alpha 4 \cdot V\text{in}^4 + \alpha 5 \cdot V\text{in}^5 + \alpha 6 \cdot V\text{in}^6 + \alpha 7 \cdot V\text{in}^7 \quad (1)$$

Where, each of $\alpha 0$ to $\alpha 7$ is a coefficient for the corresponding order term and depends on the power amplifying circuit. Note that these coefficients may change due to aging and the like.

If a distortion-free signal is power-amplified by a power amplifying circuit characterized by equation (1), its output signal Vout is distorted according to the values of. $\alpha 0$ to $\alpha 7$. Of the odd-order terms, the third-order, fifth-order and seventh-order terms generates the third-order intermodulation distortion (IM3), fifth-order intermodulation distortion (IM5) and seventh-order intermodulation distortion (IM7). Distortions generated according to the odd-order terms must be removed by a distortion compensating method such as pre-distorting compensation since they fall in a desired band or a band only for the input signal. However, the higher order terms beyond the seventh order term are not objects of removal since they are negligibly small in this embodiment.

Meanwhile, distortions generated according to the even-order terms are not objects of distortion compensation by the present invention since they fall into frequency components far from the desired band and therefore can be removed easily by filters or the like.

Accordingly, in the description of the distortion compensating technique of this embodiment, only the odd-order terms, especially the third, fifth and seventh-order terms, are considered.

Firstly, assume that an OFDM modulated wave is used as the input signal entered into the power amplifying circuit. The input OFDM modulated signal Vin is expressed as a function of amplitude and phase by equation (2):

$$V\text{in}(t) = A(t) \cdot \exp(i \cdot \theta(t)) \quad (2)$$

Where, $A(t)$: Instantaneous amplitude value
$\theta$: Instantaneous phase value.

Meanwhile, the probability density function PA $(A(t))$ of the instantaneous amplitude $A(t)$ is known to have a Rayleigh distribution as expressed by equation (3):

$$P_A(A(t)) = \frac{2A(t)}{\sigma^2} \cdot \exp\left(\frac{-A(t)^2}{\sigma^2}\right) \quad (3)$$

Where, $\sigma$ is the variance of the signal.

The probability density function $P\theta(\theta(t))$ also has a uniform distribution as expressed by equation (4) below:

$$P_\theta(\theta(t)) = 1/2\pi; -\pi < \theta \leq \pi \quad (4)$$

If the signal's variance $\sigma=1$ is assumed for simplification, equation (5) below is obtained from equation (3).

$$P_A(A(t)) = 2A(t) \cdot \exp(-A(t)^2) \quad (5)$$

From equation (5), the mean of $A(t)$ for $\sigma=1$ is calculated as expressed by equation (6) below:

$$\overline{A} = \int_{-\infty}^{+\infty} A(t) \cdot P_A(A(t)) \cdot dA = \frac{\sqrt{\pi}}{2} \quad (6)$$

Similarly, the mean of $A^n$ is calculated according to equation (7) below:

$$\overline{A^n} = \int_{-\infty}^{+\infty} A^n(t) \cdot P_A(A(t)) \cdot dA \quad (7)$$

The results are shown in Table 1 below:

TABLE 1

| n | Means of $A^n$ |
|---|---|
| 1 | $\sqrt{\pi}/2$ |
| 2 | 1 |
| 3 | $3/4 \cdot \sqrt{\pi}$ |
| 4 | 2 |
| 5 | $15/8 \cdot \sqrt{\pi}$ |
| 6 | 6 |
| 7 | $105/16 \cdot \sqrt{\pi}$ |
| 8 | 24 |
| 9 | $945/34 \cdot \sqrt{\pi}$ |
| 10 | 120 |

As described earlier, IM3, IM5 and IM7 are generated by the third, fifth and seventh-order terms in equation (1). However, these terms include components pertaining to the input signal and other order components. The third-order intermodulation distortion component is calculated by subtracting the component pertaining to the input signal from the third term. The fifth-order intermodulation distortion component is calculated by subtracting from the fifth term the component pertaining to the input signal and the component pertinent to the third order term. The seventh-order intermodulation distortion component is calculated by subtracting from the seventh term the component pertaining to the input signal, the component pertaining to the third order term and the component pertaining to the fifth order term.

To determine the magnitude of the component pertaining to the input signal and included in the third-order term in equation (1), the cross-correlation coefficient $\eta 31$ of the OFDM modulated wave is first calculated as equation (8) below:

$$\eta 31 = \overline{A^3(t) \cdot \exp(i\theta t(t)) \cdot A(t) \cdot \exp(i \cdot \theta(t))} = \overline{A^4(t)} = 2 \quad (8)$$

This equation (8) indicates that the input signal included in the third term has a magnitude of 2. Thus, the third-order intermodulation distortion is obtained by subtracting the input signal multiplied by 2 from the cube of the input signal as shown by equation (9) below:

Third-order Intermodulation Distortion=$(A^3(t)-2A(t))$
$\cdot \exp(i\theta(t))$ (9)

Then, the root mean square of equation (9) is calculated by consulting with Table 1. Since the result is "2", the variance of the third-order intermodulation distortion expressed by equation (9) is $\sqrt{2}$.

Therefore, the third-order intermodulation distortion IM3 is expressed as equation (10) below if the variance is 1:

$$IM3 = \frac{A(t) \cdot (A^2(t) - 2)}{\sqrt{2}} \cdot \exp(i\theta t(t)) \quad (10)$$

Similarly, the fifth-order intermodulation distortion IM5 is expressed as equation (11) below if the variance is 1:

$$IM5 = \frac{A(t) \cdot (A^4(t) - 6A^2 + 6)}{\sqrt{12}} \cdot \exp(i\theta t(t)) \quad (11)$$

Also similarly, the seventh-order intermodulation distortion IM7 is expressed as equation (11) below if the variance is 1:

$$IM7 = \frac{A(t) \cdot (A^6(t) - 12A^4(t) + 36A^2(t) - 24)}{12} \cdot \exp(i\theta t(t)) \quad (12)$$

By substituting:

$$A3(t) = \frac{A^2(t) - 2}{\sqrt{2}} \quad (13)$$

$$A5(t) = \frac{A^2(t) - 6A^2 + 6}{\sqrt{12}} \quad (14)$$

$$A7(t) = \frac{A^6(t) - 12A^4(t) + 36A^2(t) - 24}{12} \quad (15)$$

the output voltage Vout including IM3, IM5 and IM7 generated in the power amplifier can be expressed by equation (16) below:

$V\text{out}(t) = A(t) \cdot \exp(i \cdot \theta(t))\{1 + \alpha 3 \cdot A3(t) + \alpha 5 \cdot A5(t) + \alpha 7 \cdot A7(t)\}$ (16)

The following describes how the distortion coefficients $\alpha 3$, $\alpha 5$ and $\alpha 7$ are calculated. Subtracting the distortion-free equation (2) from the distortion-included equation (16) results in an error signal err expressed by equation (17) below:

$err(t) = A(t) \cdot \exp(i \cdot \theta(t))\{\alpha 3 \cdot A3(t) + \alpha 5 \cdot A5(t) + \alpha 7 \cdot A7(t)\}$ (17)

Further, multiplying the error signal equation (17) by equation (2) as complex conjugates results in a product u expressed by equation (18) below:

$u(t) = A(t)^2 \{\alpha 3 \cdot A3(t) + \alpha 5 \cdot A5(t) + \alpha 7 \cdot A7(t)\}$ (18)

Further, the mean product xcor3 of u(t) of equation (18) and A3 of equation (10) results in equation (19) below:

$$xcor3(t) = \alpha 3 \cdot \overline{A(t)^2 \cdot A3(t)^2} + \alpha 5 \cdot \overline{A(t)^2 \cdot A3(t) \cdot A5(t)} + \quad (19)$$
$$\alpha 7 \cdot \overline{A(t)^2 \cdot A3(t) \cdot A7(t)}$$
$$= \alpha 3$$

The third-order coefficient $\alpha 3$ can be detected by calculation in this manner.

Likewise, the mean product xcor5 of equation (18) u(t) and equation (11) results in equation (20) below:

$$xcor5(t) = \alpha 3 \cdot \overline{A(t)^2 \cdot A3(t) \cdot A5(t)} + \alpha 5 \cdot \overline{A(t)^2 \cdot A5(t)^2} + \quad (20)$$
$$\alpha 7 \cdot \overline{A(t)^2 \cdot A5(t) \cdot A7(t)}$$
$$= \alpha 5$$

This allows the fifth-order coefficient $\alpha 5$ to be detected.

Likewise, the mean product xcor7 of equation (18) u(t) and equation (12) results in equation (21) below:

$$xcor7(t) = \alpha 3 \cdot \overline{A(t)^2 \cdot A3(t) \cdot A7(t)} + \alpha 5 \cdot \overline{A(t)^2 \cdot A5(t) \cdot A7(t)} + \quad (21)$$
$$\alpha 7 \cdot \overline{A(t)^2 \cdot A7(t)^2}$$
$$= \alpha 7$$

This allows the seventh-order coefficient $\alpha 7$ to be detected.

As described so far, the third-order coefficient $\alpha 3$, fifth-order coefficient $\alpha 5$ and seventh-order coefficient $\alpha 7$ are determined from the input signal Vin and output signal Vout and further the error signal is determined as err(t) from A3 (t), A5 (t) and A7 (t). It is therefore possible to reduce the distortion of the output signal by generating a distortion compensating signal which is opposite in characteristics to the distortion signal and adding it to the input signal.

The following describes the other compensating signal. It is a fixed correction-compensating signal for small amplitude levels of the input signal.

Usually, the power amplifier is of the push-pull type. The input signal is converted "unbalanced" to "balanced" by an input transformer before applied to a pair of FET gates with a phase difference of 180 degrees. The input signal is amplified there and converted "balanced" to "unbalanced" by an output transformer before output. In this case, the drain current of each FET does not flow almost at all when the gate bias voltage is small. In a continuous voltage region where the pushed or pulled FET is switched to the other FET, the drain current does not flow almost all. This region is distorted in characteristics when compared with regions where the drain current flows and changes. Usually, this distortion is called a crossover distortion.

In such a crossover distortion region, it is difficult to compensate for the distortion by using the aforementioned autonomous correction-compensating signal since the level change cannot easily be detected by the flowing drain current. However, attention is directed to the fact that the signal level does not change almost at all in a region where there is almost no signal level. It is possible to reduce the distortion of the output signal by preparing a compensating section where a characteristically opposite fixed correction compensating signal is created and stored in advance and adding the compensating signal to the input signal.

Figure 4A:
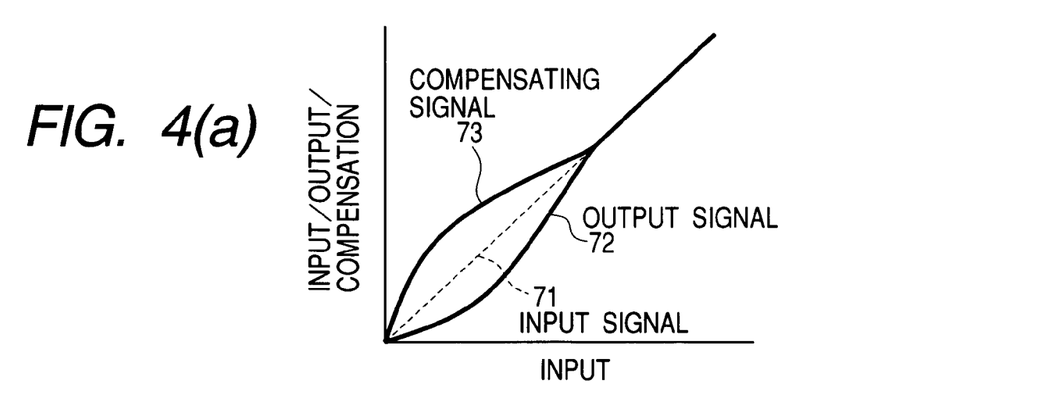
FIGS. 4A, 4B and 4C diagrams for explaining how crossover distortions are reduced.
Figure 4B:
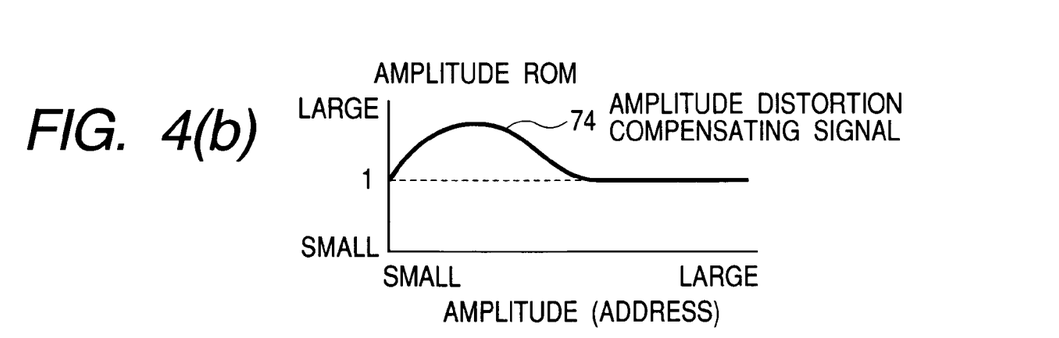
Figure 4C:
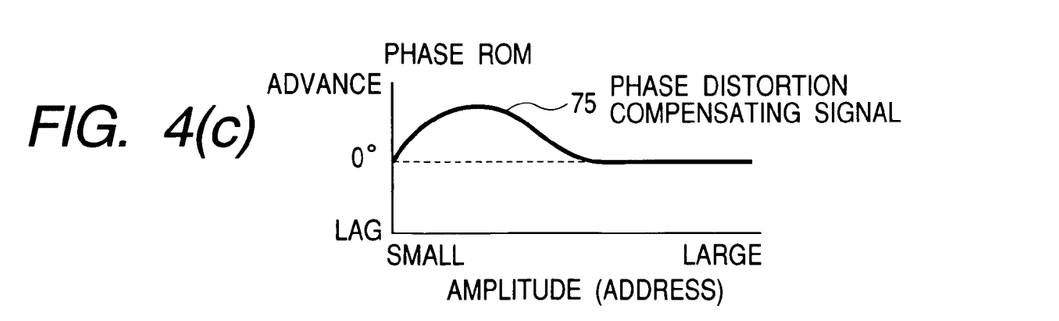

FIGS. 4A, 4B and 4C illustrate reduction of the crossover distortion. FIG. 4A is an enlarged diagram of a region where the input signal 71 has no signal level almost at all. In this region, the output signal 72 of the power amplifier 55 shows a reduction in the signal level almost down to zero. Since the signal level does not change almost at all, a fixed correction compensating signal, which is characteristically opposite to the output signal 72, is prepared in advance and added to the input signal. The fixed correction compensating signal 73 opposite characteristically to the output signal 72 may comprise an amplitude distortion compensating signal 74 as shown in FIG. 4B and a phase distortion compensating signal 75 as shown in FIG. 4C. This makes it possible to generate a distortion-reduced output signal that is almost identical to the input signal 71.

By using two types of compensating signals as described so far, the distortion of the input signal whose signal level ranges from a small level to a large level is reduced, so that the accuracy of distortion compensation can be raised and the converging time can be shortened.

Figure 1:
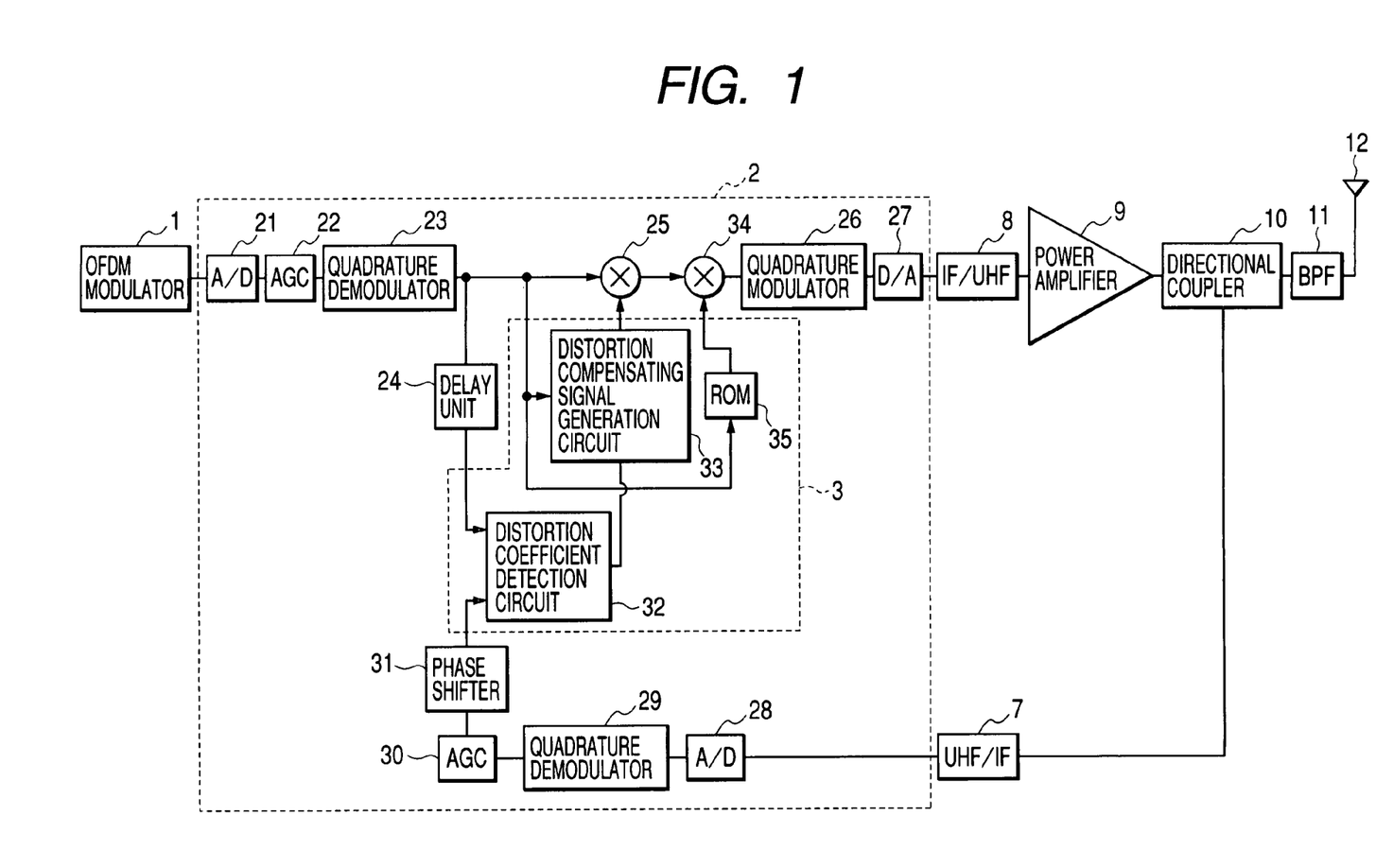
FIG. 1 is a block diagram of a transmitter including a power amplifier according to an embodiment of the present invention.

With reference to figures, the embodiment described so far is described more concretely. FIG. 1 is a block diagram of a transmitter including a power amplifier according to the embodiment of the present invention.

In FIG. 1, an input signal output from an OFDM modulator 1 is entered into a distortion compensating circuit 2 of the present invention. The input signal is converted to a digital signal by an A/D converter 21. The converted signal is gain adjusted to an appropriate level by an AGC 22 and further demodulated to a baseband signal by an quadrature demodulator 23. The demodulated signal is input to a multiplier 25 and a delay unit 24. The signal entered into the delay unit 24 is given appropriate delay adjustment there and entered into a distortion coefficient detection circuit 32 of a distortion compensation calculating circuit 3. The signal output from the multiplier 25 is entered into a multiplier 34 and the signal output from the multiplier 34 is modulated by an quadrature modulator 26, converted to an analog signal by a D/A converter 27 and output from the distortion compensating circuit 2 to an IF/UHF converter 8. The signal is converted to a UHF band frequency by the IF/UHF converter 8 and power-amplified to a prescribed level by a power amplification circuit 9. The signal output from the power amplification circuit 9 includes distortion components as mentioned earlier. The output signal from the power amplification circuit 9 is aired from an antenna 12 via a directional coupler 10 and a BPF 11.

Concurrently, the output signal is partly distributed by the directional coupler 10 to a UHF/IF converter 7 by which the output signal is converted to an IF frequency before entered into the distortion compensating circuit 2. This output signal is converted to a digital signal by an A/D converter 28. The converted output signal is demodulated by an quadrature demodulator 29, adjusted to an appropriate level by an AGC 30 and adjusted to an appropriate phase by an phase shifter 31 before entered into the distortion coefficient detection circuit 32.

The AGC 30 operates so as to make the output level of the phase shifter 31 equal to the output level of the delay unit 24. In addition, the delay unit adjusts the delay time so as to synchronize the two signals entered into the distortion coefficient detection circuit 32 whereas the phase shifter 31 adjusts the phase so that the signals entered into the distortion coefficient detection circuit 32 have the same phase.

From the two input signals, the distortion coefficient detection circuit 32 detects the third, fifth and seventh-order amplitude distortion coefficients and the third, fifth and seventh-order phase distortion coefficients. Based on these coefficients, a distortion-compensating signal generating circuit 33 generates a distortion-compensating signal. By the multiplier 25, the distortion-compensating signal is added to the signal from the quadrature demodulator 23. This realizes accurate and quick pre-distortion compensating operation for relatively large amplitude levels of the input signal.

In addition, a fixed correction compensating signal is entered into the multiplier 34 from a fixed correction ROM 35 prepared for small amplitude levels of the input signal. By the multiplier 34, the fixed correction-compensating signal is added to the signal from the quadrature demodulator 23. Thus, accurate and quick pre-distortion compensating operation is also realized for small amplitude levels of the input signal.

Figure 2:
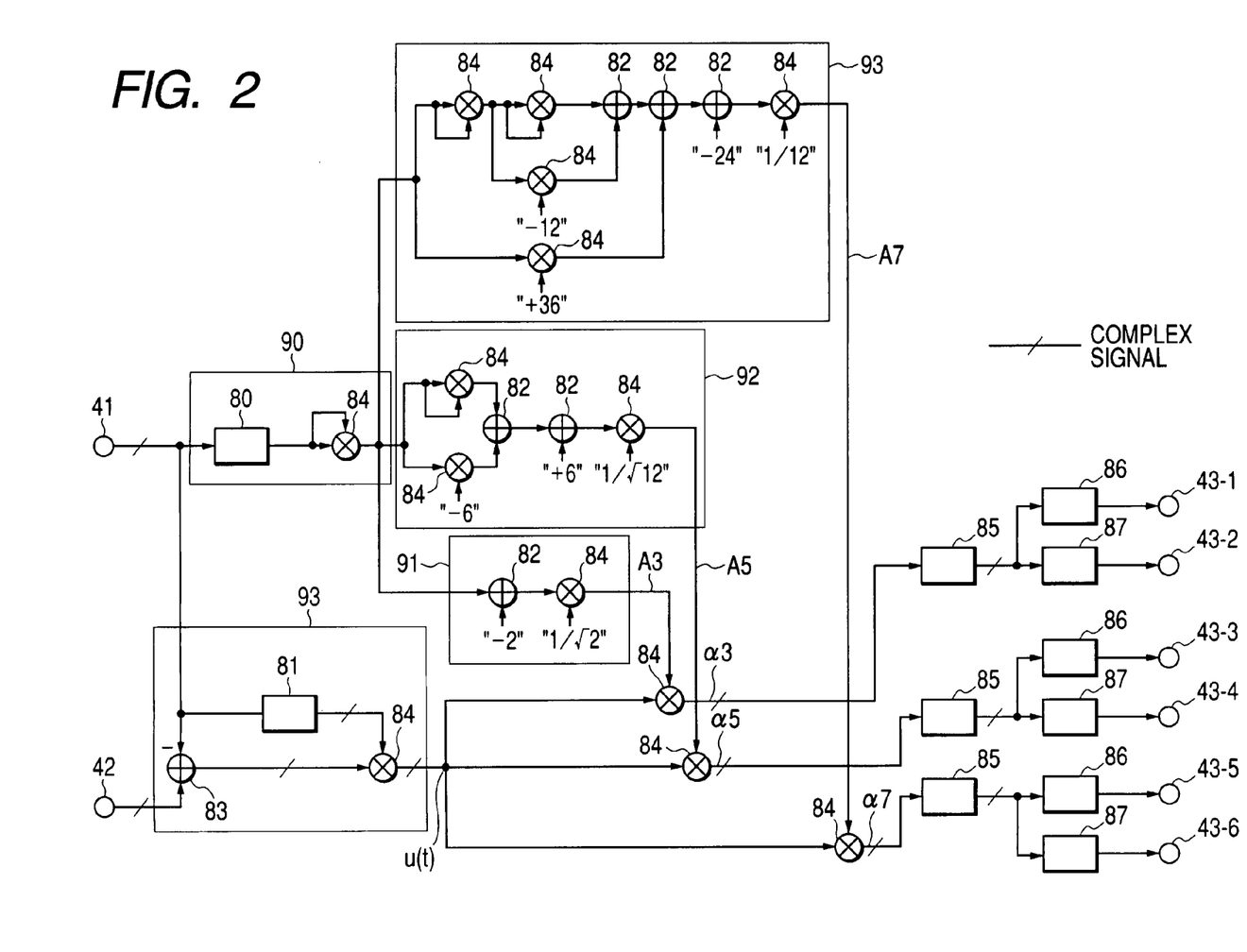
FIG. 2 is a block diagram showing an embodiment of the distortion coefficient detection circuit in the distortion compensating circuit of FIG. 1.
Figure 3:
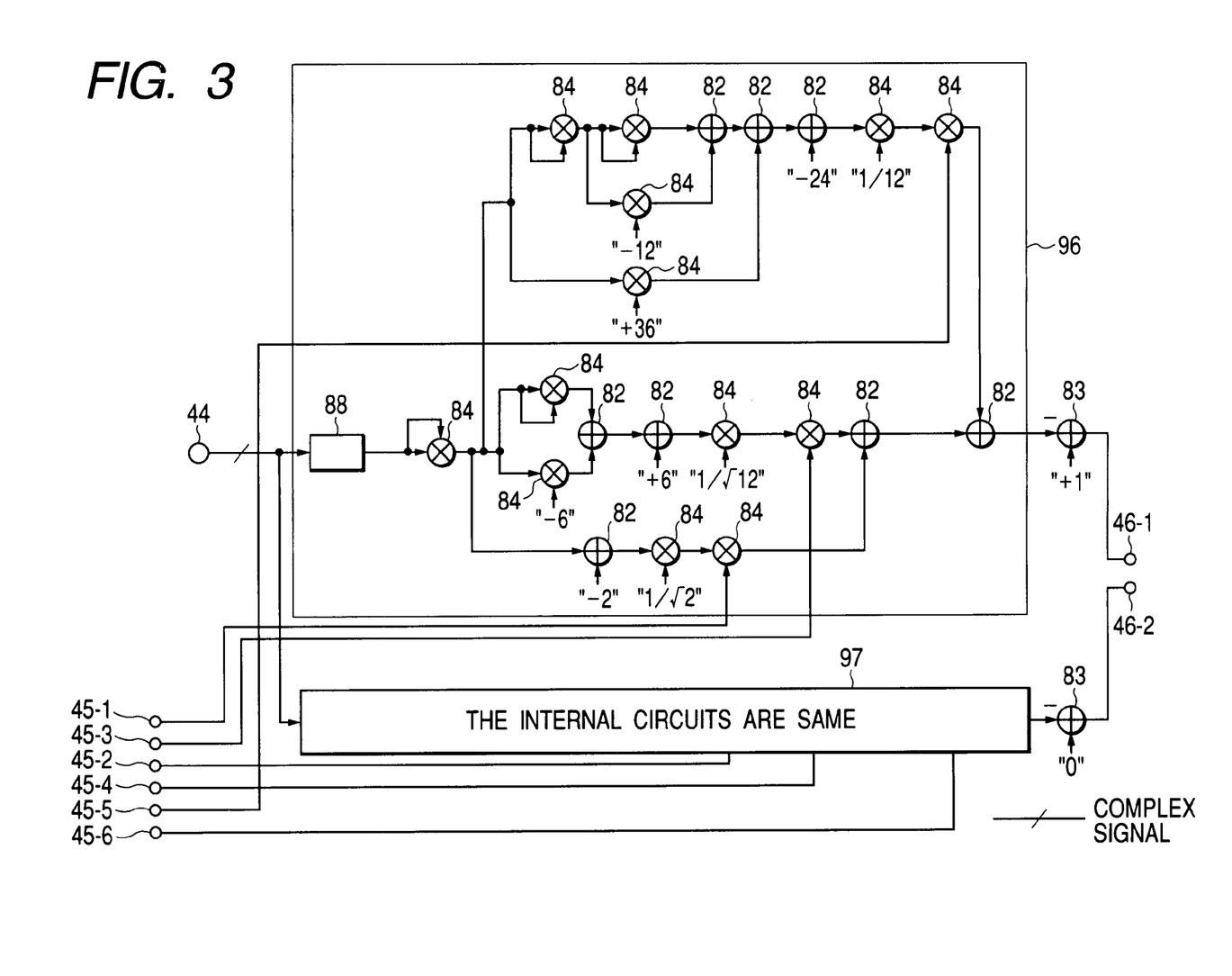
FIG. 3 is a block diagram showing an embodiment of the distortion compensating signal generating circuit in the distortion compensating circuit of FIG. 1.

The following describes embodiments of the distortion coefficient detection circuit 32 and distortion compensating signal generating circuit 33 in the distortion compensating circuit 2 with reference to figures. FIG. 2 is a block diagram showing an embodiment of the distortion coefficient detection circuit 32 in the distortion compensating circuit 2 in FIG. 1. FIG. 3 is a block diagram showing an embodiment of the distortion compensating signal generating circuit 33 in the distortion compensating circuit 2 in FIG. 1. The autonomous correction compensating signal is generated through the distortion coefficient detection circuit 32 and distortion compensating signal generating circuit 33.

In FIG. 2, the output signal from the delay unit 24 is entered into a terminal 41 of the distortion coefficient detection circuit 32 shown in FIG. 1 whereas the output signal from the phase shifter 31 is entered into a terminal 42. The input signal to the terminal 41 is entered into an absolute value circuit 80 of a circuit block (circuit bocks hereinafter denoted as blocks) 90 where the input signal is converted to a real signal representing the absolute value of the complex signal. Its real signal is entered into a multiplier 84 and squared there before output from the block 90 into a block 91, a block 92 and a block 93. The block 91 is a circuit block to output the value of A3(t) according the aforementioned equation (13). Likewise, the block 92 is a circuit block to output the value of A5(t) according to the aforementioned equation (14) whereas the block 93 is a circuit block to output the value of A7(t) according to the aforementioned equation (15).

Concurrently, the input signal to the terminal 42 is entered into a block 94 together with the input signal entered into the terminal 41. The block 94 is a circuit block to output the value of u(t) according to the aforementioned equation (18).

The signal u(t) from this block 94 is concurrently multiplied by the signal A3(t), signal A5(t) and signal A7(t) by multipliers 84 and the results are respectively averaged by averaging circuits 85 before output as the aforementioned complex signals α3, α5 and α7. Then, the signals α3, α5 and α7 are respectively processed by real circuits 86 and imag circuits 87 into the three-order amplitude distortion coefficient signal, three-order phase distortion coefficient signal, fifth-order amplitude distortion coefficient signal, fifth-order phase distortion coefficient signal, seventh-order amplitude distortion coefficient signal and seventh-order phase distortion coefficient signal. They are output into the distortion compensating signal generating circuit 33 via terminals 43-1 to 43-6.

Into terminals 45-1 to 45-6 of the distortion compensating signal generating circuit 33 in FIG. 1, the aforementioned three-order amplitude distortion coefficient signal, three-order phase distortion coefficient signal, fifth-order amplitude distortion coefficient signal, fifth-order phase distortion coefficient signal, seventh-order amplitude distortion coefficient signal and seventh-order phase distortion coefficient signal are entered as shown in FIG. 3. In addition, the input signal from the delay unit 24 of FIG. 1 is entered into a terminal 44. The input signal entered into the terminal 44 is concurrently entered into a block 96 and a block 97. From the input signal entered via the terminal 44, the three-order amplitude distortion coefficient signal entered via the terminal 45-1, the fifth-order amplitude distortion coefficient signal entered from the terminal 45-3 and the seventh-order amplitude distortion coefficient signal entered via the terminal 45-5, the block 96 outputs a signal of the real part value of the aforementioned err(t) equation (17). The block 97 outputs a signal of the imaginary part value of the aforementioned err(t) equation (17) from the input signal entered via the terminal 44, the third-order phase distortion coefficient signal entered from 45-2, the fifth-order phase distortion coefficient signal entered via 45-4 and the seventh-order phase distortion coefficient signal entered via 45-6.

The err(t) real part value signal output from the block 96 is subtracted from a value 1 signal by an adder 83. The err(t) imaginary part value signal output from the block 97 is subtracted from a value 0 signal by an adder 83. The resulting signals are respectively output to the multiplier 25 of FIG. 1 via terminals 46-1 and 46-2 and multiplied by the input signal there. This multiplier 25 may be a vector multiplier capable of performing multiplication by using the real part and imaginary part signals. The signals obtained by respectively subtracting the err(t) imaginary and real part signals are output as distortion compensating signals. Note that the err(t) real part value signal is subtracted from the value 1 signal by the adder 83. The value 1 allows the subsequent multiplier 25 to hold the input signal from the quadrature demodulator while the amplitude-compensating signal is made characteristically opposite to the amplitude distortion generated by the power amplifier. In addition, the imaginary part value is subtracted from 0 to make the phase compensating signal characteristically opposite to the phase distortion generated in the power amplifier.

As described so far, from the input signal to a power amplifier and the output error signal from the power amplifier, this embodiment of the present invention can accurately and quickly detect the third-order, fifth-order and seventh-order coefficients by means of calculation without using the perturbation method. In addition, the embodiment can accurately and quickly generate distortion-compensating signals based on these coefficients. Thus, it is possible to remarkably raise the accuracy of distortion compensation and shorten the converging time.

The following describes fixed correction compensating signals. The fixed correction compensating are prepared and stored in the fixed correction ROM 35. The correction ROM 35 comprises an amplitude distortion ROM for storing amplitude distortion compensating signals 74 shown in FIG. 4(b) and a phase distortion ROM for storing phase distortion compensating signals. Addresses are assigned to amplitudes of the output signal from the quadrature demodulator 23. Therefore, when the output signal of the quadrature demodulator 23 has an amplitude, characteristically opposite compensating signals associated with the amplitude are output.

By correcting the input signal with the autonomous correction and fixed correction compensating signals through the multipliers 25 and 34, it is possible to achieve an accurate, fast convergence and wide amplitude range distortion compensating circuit, distortion compensating signal generating method and power amplifier which can compensate for not only crossover distortions caused at small amplitude levels but also those caused at relatively large amplitude levels.

INDUSTRIAL APPLICABILITY

Since pre-distorting compensation for power amplification according to the present invention makes it possible to accurately and quickly generate distortion compensating signals, it is possible to provide a distortion compensating circuit, distortion compensating signal generating method and power amplifier which are superior in the accuracy of distortion compensation and the speed of convergence.

What is claimed is:

1. A distortion compensating circuit which detects distortion components generated in a power amplifying circuit amplifying power of a high frequency input signal according to an output signal and an input signal of the power amplifying circuit; and generates a distortion compensating signal according to the detected distortion components, said distortion compensating circuit comprising:
   an adjustment circuit which adjusts the input signal and the output signal so as to eliminate a level error, a phase error and a delay error between the input signal and the output signal;
   a distortion coefficient detection circuit which calculates an error signal representing the difference between the adjusted input signal and output signal, and calculates, from the calculated error signal and the input signal, at least a coefficient, specific to the power amplifying circuit, of a third-order intermodulation distortion partly constituting the detected distortion components and additionally a coefficient, specific to the power amplifying circuit, of a fifth-order intermodulation detected distortion partly constituting the distortion components and a coefficient, specific to the power amplifying circuit, of a seventh-order intermodulation distortion partly constituting the detected distortion components; and
   a distortion compensating signal generating circuit which generates, according to the calculated coefficients, a distortion compensating signal which is characteristically opposite in phase and gain to the intermodulation distortions.

2. A distortion compensating signal generating method for detecting distortion components generated in a power amplifying circuit amplifying power of a high frequency input signal according to the output signal and the input signal; and generating a distortion compensating signal according to the detected distortion components, said distortion compensating signal generating method comprising the steps of:
   adjusting the input signal and the output signal so as to eliminate a level error, a phase error and a delay error between the input signal and the output signal;
   calculating an error signal representing the difference between the adjusted input signal and output signal,
   calculating, from the calculated error signal and the input signal, at least a coefficient, specific to the power amplifying circuit, of a third-order intermodulation distortion partly constituting the detected distortion components and additionally a coefficient, specific to the power amplifying circuit, of a fifth-order intermodulation distortion partly constituting the detected distortion components and a coefficient, specific to the power amplifying circuit, of a seventh-order intermodulation distortion partly constituting the detected distortion components are calculated; and generating, according to the calculated coefficients, a distortion compensating signal which is characteristically opposite in phase and gain to the intermodulation distortions.

3. A power amplifier comprising:

a power amplifying circuit which amplifies power of a high frequency input signal;

a distortion compensating circuit which detects distortion components generated in the power amplifying circuit according to the output signal and the input signal and generates a distortion compensating signal according to the detected distortion components; and an adder circuit which adds the generated distortion compensating signal to the input signal, wherein said distortion compensating circuit comprises:

an adjustment circuit which adjusts the input signal and the output signal so as to eliminate a level error, a phase error and a delay error between the input signal and the output signal, a distortion coefficient detection circuit which calculates an error signal representing the difference between the adjusted input signal and output signal, and calculates from the calculated error signal and the input signal, at least a coefficient, specific to the power amplifying circuit, of a third-order intermodulation distortion partly constituting the detected distortion components and additionally a coefficient, specific to the power amplifying circuit, of a fifth-order intermodulation distortion partly constituting the detected distortion components and a coefficient, specific to the power amplifying circuit, of a seventh-order intermodulation distortion partly constituting the detected distortion components, and a distortion compensating signal generating circuit which generates, according to the calculated coefficients, a distortion compensating signal which is characteristically opposite in phase and gain to the intermodulation distortions.

4. A distortion compensating circuit which detects distortion components generated in a power amplifying circuit amplifying power of a high frequency input signal according to an output signal and the input signal, and generates a distortion compensating signal according to the detected distortion components, said distortion compensating circuit comprising:

an adjustment circuit which adjusts the input signal and the output signal so as to eliminate a level error, a phase error and a delay error between the input signal and the output signal;

an autonomous correction compensating signal generating circuit for relatively large amplitude levels of the input signal, including:

a distortion coefficient detection circuit which calculates an error signal representing a difference between the adjusted input signal and output signal is calculated and, from the calculated error signal and the input signal, at least a coefficient, specific to the power amplifying circuit, of a third-order intermodulation distortion partly constituting the distortion detected components and additionally a coefficient, specific to the power amplifying circuit, of fifth-order intermodulation distortion partly constituting the detected distortion components and a coefficient, specific to the power amplifying circuit, of a seventh-order intermodulation distortion partly constituting the detected distortion components, and a distortion compensating signal generating circuit which generates, according to the calculated coefficients, a distortion compensating signal which is characteristically opposite in phase and gain to the intermodulation distortions; and a fixed correction compensating signal generating circuit for small amplitude levels of the input signal, which generates a distortion compensating signal characteristically opposite to the input signal.

* * * * *